(12) United States Patent
Meyers

(10) Patent No.: US 6,927,497 B2
(45) Date of Patent: Aug. 9, 2005

(54) MULTI-DIE SEMICONDUCTOR PACKAGE

(75) Inventor: John G. Meyers, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/226,070

(22) Filed: Aug. 22, 2002

(65) Prior Publication Data

US 2004/0036163 A1 Feb. 26, 2004

(51) Int. Cl.⁷ .............................................. H01L 23/48
(52) U.S. Cl. ..................... 257/777; 257/678; 257/686; 438/108; 438/109
(58) Field of Search ................................ 257/777, 678, 257/686, 696, 712; 438/108, 109

(56) References Cited

U.S. PATENT DOCUMENTS

| | | | |
|---|---|---|---|
| 5,506,753 A | * 4/1996 | Bertin et al. ................. | 361/705 |
| 6,184,064 B1 | * 2/2001 | Jiang et al. .................. | 438/113 |
| 6,208,521 B1 | * 3/2001 | Nakatsuka ................... | 361/749 |
| 6,225,695 B1 | * 5/2001 | Chia et al. ................... | 257/712 |
| 6,297,548 B1 | * 10/2001 | Moden et al. ............... | 257/686 |
| 6,433,418 B1 | * 8/2002 | Fujisawa et al. ............. | 257/696 |
| 6,683,377 B1 | * 1/2004 | Shim et al. .................. | 257/723 |
| 2003/0062614 A1 | * 4/2003 | Larson ........................ | 257/688 |
| 2003/0148597 A1 | * 8/2003 | Tan et al. .................... | 438/612 |

* cited by examiner

Primary Examiner—David Nelms
Assistant Examiner—Long Tran
(74) Attorney, Agent, or Firm—Schwegman, Lundberg, Woessner & Kluth, P.A.

(57) ABSTRACT

A semiconducting package includes a first capsule, a second capsule and an adhesive within a recess in a surface of the first capsule that secures the first capsule to the second capsule.

18 Claims, 3 Drawing Sheets

US 6,927,497 B2

MULTI-DIE SEMICONDUCTOR PACKAGE

TECHNICAL FIELD

A semiconductor package, and in particular a semiconductor package with multiple dice.

BACKGROUND

High performance semiconducting devices now require more innovative circuit design. Each increase in speed and power generally carries a cost of increased size such that additional innovations must be in order to minimize the size of semiconducting device packages.

Several methods have been employed to minimize the package size of semiconducting packages. One method includes encapsulating a plurality of dice or chips onto a tape substrate to form capsules and then folding the tape substrate to place the capsules one on top of another.

FIGS. 1–3 illustrate such a prior art semiconducting package 10. Semiconducting package 10 includes three capsules 21, 22, 23 that are encapsulated on a front side 14 of tape substrate 12. Each capsule 21, 22, 23 may have one or more dice encapsulated therein. The distance between each capsule 21, 22, 23 on tape substrate 12 will vary depending on the thickness and flexibility of tape substrate 12 as well as the size of the capsules 21, 22, 23. The distance between capsules 21 and 22 shown in FIG. 1 is equal to the distance between capsules 21 and 23. In other packages, the distances between capsules may vary depending on how the capsules are stacked together. As the number and arrangement of capsules changes, the distances between adjacent capsules changes accordingly.

The electronics circuits in capsules 21, 22, 23 communicate with each other through conductive paths formed in tape substrate 12. The thickness of capsules 21, 22, 23 is typically about 0.2 millimeter (mm) and the thickness of tape substrate 12 is typically about 0.1 mm. The distances between device units 21–23 is typically in the range 0.9–2.1 mm.

The dice may be encapsulated by any known procedure, such as molding and sealing. Other fabrication processes such as wire bonding, lead bonding, bump bonding, and die stacking are typically done to device units 21–23 prior to encapsulation. In addition, device units 21–23 are often subjected to additional processes such as ball attaching and/or marking after encapsulation. It should be noted that semiconducting device packages may include any number of device units formed on the front and/or back sides 14, 16 of tape substrate 12.

As shown in FIG. 2, the packaging process includes folding the tape substrate 12 to stack the capsules 21, 22, 23. An adhesive is manually or automatically dispensed between capsules 21, 22, 23 in the stack and cured to hold the package together. Each layer of adhesive increases the thickness, or "Z" height, of the package.

FIG. 3 shows capsule 21 in greater detail. Capsule 21 includes a die 24 that is mounted on the front side 14 of tape substrate 12 by encapsulating die 24 within an epoxy 25 or some other suitable material. Solder balls 15 in a ball grid array are mounted on the back side 16 of tape substrate 12 to form an electrical-mechanical connection between capsule 21 and other electrical devices. Capsule 21 is typically electrically connected to tape substrate 12 at its mating surface as well as via wire bonds 17.

Capsule 21 includes a flat upper surface 27 that mates with a similar flat surface on another capsule such as capsule 22 after tape substrate 12 has been folded. An adhesive is positioned between the flat mating surfaces of adjacent capsules 21, 22 to secure capsules 21, 22 together. The thickness of the adhesive detrimentally adds to the Z height of existing semiconducting packages. As shown in FIG. 2, capsule 23 is secured to capsules 21, 22 by folding tape substrate 12 to position capsule 23 against a back side of tape substrate 12 opposite to capsule 22.

One of the goals in semiconducting device packaging is to reduce the Z height of the packages. Therefore, it would be desirable to be able to adhere several stacked dice together into a package without adding significant Z height to the package. Any improvements in packaging semiconducting devices that include stacked dice would also not add significantly to the cost of fabricating such semiconducting devices.

DETAILED DESCRIPTION

Figure 1:
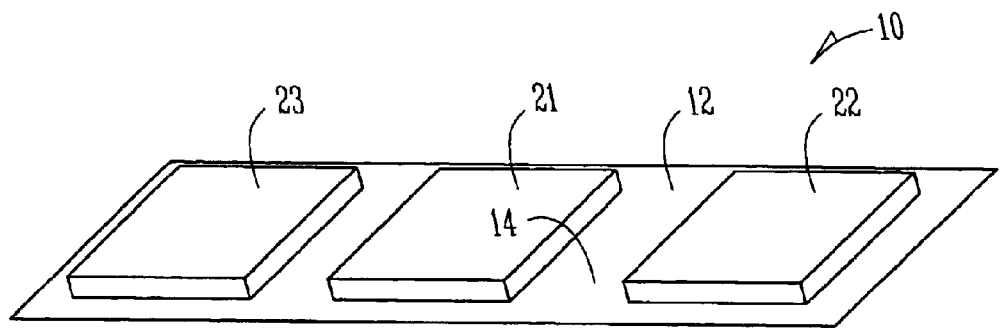
FIG. 1 is a perspective view illustrating a prior art semiconducting package prior to folding.

In the following detailed description reference is made to the accompanying drawings. In the drawings, like numerals describe substantially similar components throughout the several views. Other embodiments may be utilized, and structural, logical, and electrical changes may be made.

Figure 4:
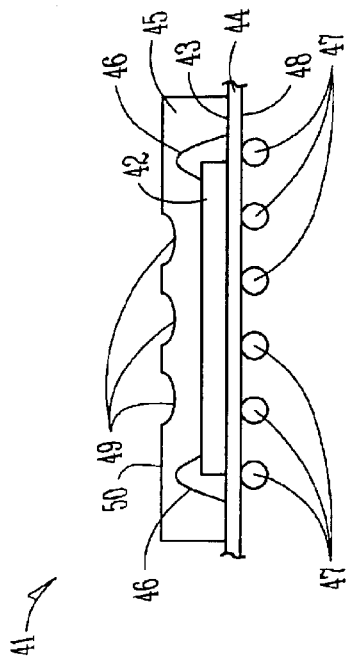
FIG. 4 is a schematic section view illustrating a capsule in a semiconducting package with reduced Z height.
Figure 6:
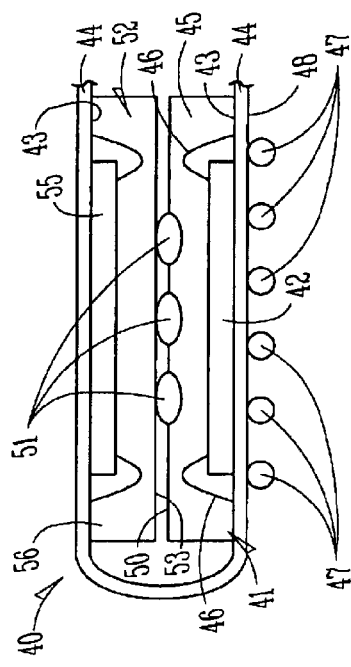
FIG. 6 is a schematic section view illustrating a semiconducting package with reduced Z height.

FIG. 4 illustrates a capsule 41 that forms part of a semiconducting package 40 (see FIG. 6). Capsule 41 includes a die 42 that is mounted to a front side 43 of a substrate, such as a tape substrate 44 by encapsulating die 42 within an epoxy 45 or some other suitable material. Capsule 41 can be electrically connected to substrate 44 at its mating surface as well as via wire bonds 46. Solder balls 47 may also be mounted on a back side 48 of substrate 44 to form an electrical-mechanical connection between capsule 41 and other electrical devices.

Capsule 41 includes recesses 49 that extend into epoxy 45 from an upper surface 50 of capsule 41. The number of recesses 49 will vary depending on the type of package 40.

Figure 5:
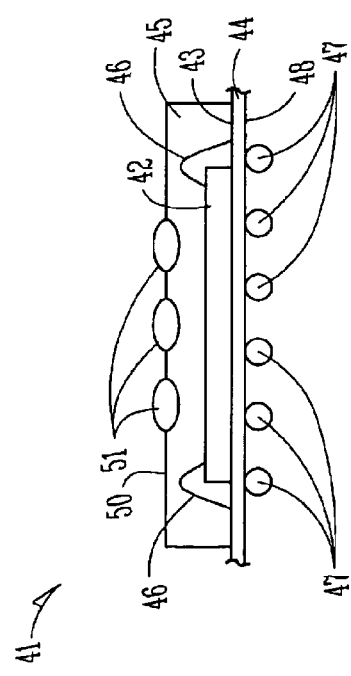
FIG. 5 is a schematic section view similar to FIG. 4 illustrating the capsule shown in FIG. 4 with an adhesive applied to the capsule.

As shown in FIG. 5, recesses 49 are adapted to receive an adhesive 51 that secures capsule 41 to one or more other capsules in package 40. In some embodiments, recesses 49 fit between wire bonds 46. Recesses 49 can be grooves, dimples, channels or any other type of geometric structure that can hold adhesive 51.

FIG. 6 shows another capsule 52 stacked onto capsule 41. Capsule 52 is secured to capsule 41 by adhesive 51. Although capsule 52 is shown with a flat mating surface 53, it should be understood that capsule 52 may include recesses that are not aligned, partially aligned, or wholly aligned with recesses 49 on capsule 41.

In the illustrated example embodiment, there is more adhesive 51 than the volume of each recess 49 such that adhesive 51 extends above upper surface 50 of capsule 41. It should be noted that amount of adhesive 51 will be based on the size and geometry of the recesses and capsules and type of adhesive. In some embodiments there will be just enough adhesive to secure capsule 41 to capsule 52 such that upper surface 50 of capsule 41 engages flat mating surface 53 of capsule 52.

A method of packaging multiple dice into a semiconducting device is also described herein. The method includes filling recesses 49 in an upper surface 50 of capsule 41 with adhesive 51 and securing capsule 41 to capsule 52 using adhesive 51. The method may further include encapsulating a first die 42 with epoxy 45 to form capsule 41 and encapsulating a second die 55 with epoxy 56 to form capsule 52. Encapsulating first and second dice 42, 55 may include encapsulating first and second dice 42, 55 on a front side 43 of a common tape substrate 44 such that capsule 41 is adjacent to capsule 52. Capsule 41 is secured to capsule 52 by folding tape substrate 44 to position capsule 41 against capsule 52.

Figure 2:
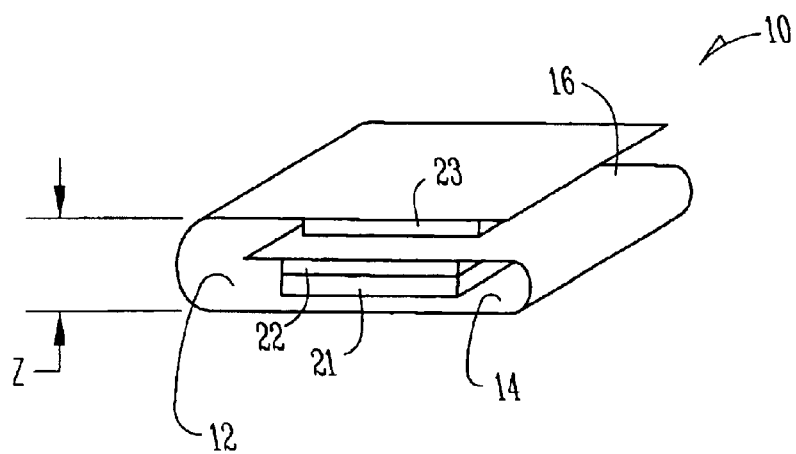
FIG. 2 is perspective view similar to FIG. 1 illustrating the prior art semiconducting package of FIG. 1 after folding.
Figure 3:
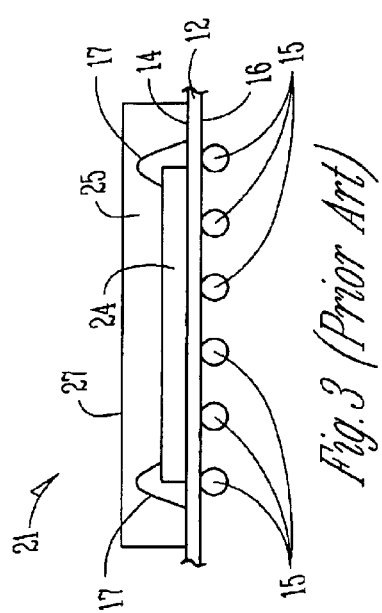
FIG. 3 is a schematic section view illustrating a capsule in a prior art semiconducting package of FIG. 1.

In an alternative form, the method further includes encapsulating a third die (see, e.g., FIGS. 1–3) on the front side 43 of tape substrate 44 to form a third capsule and securing the third capsule to first and second capsules 41, 52 by folding tape substrate 44 and using an adhesive. Tape substrate 44 may be folded to position the third capsule against the back side 48 of tape substrate 44 opposite to capsule 52. As described relative to FIGS. 1–3, the arrangement of the third capsule relative to capsules 41, 52 will depend on a variety of circuit design factors.

A number of materials may be used for epoxy 45, 56 and adhesive 51. The choice of materials will depend on the relevant circuit design considerations and the costs that are associated with fabricating the semiconducting package.

Figure 7:
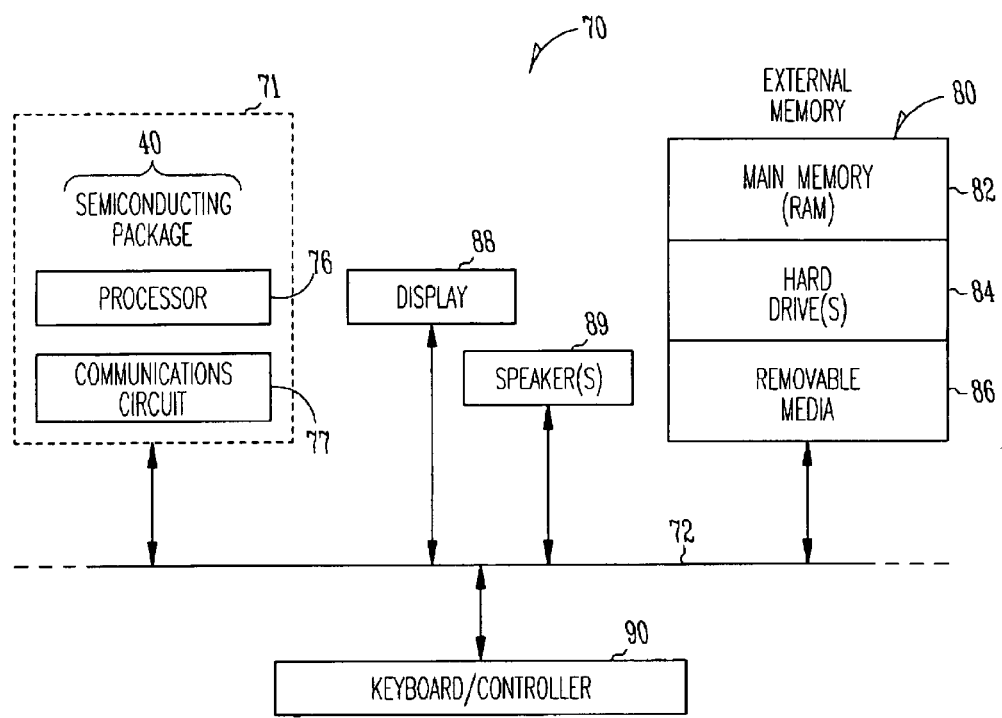
FIG. 7 is a block diagram of an electronic system incorporating at least one semiconducting package of the type shown in FIG. 6.

FIG. 7 is a block diagram of an electronic system 70, such as a computer system, that includes an electronic device 71 which is electrically coupled to various components in electronic system 70 via a system bus 72. Electronic device 71 includes at least one semiconducting package, such as semiconducting package 40 shown in FIG. 6. Electronic device 71 may further include a microprocessor, a microcontroller, a graphics processor or a digital signal processor 76, and/or a custom circuit or an application-specific integrated circuit, such as communications circuit 77 for use in wireless devices such as cellular telephones, pagers, portable computers, two-way radios, and similar electronic systems. System bus 72 may be a single bus or any combination of busses.

The electronic system 70 may also include an external memory 80 that in turn includes one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

Semiconducting package 40 can be implemented in a number of different embodiments, including an electronic system and a computer system. The elements, materials, geometries, dimensions, and sequence of operations can all be varied to suit particular packaging requirements.

FIGS. 1–7 are merely representational and are not drawn to scale. Certain proportions thereof may be exaggerated, especially as to capsules 41, 52, recesses 49 and adhesive 51 while others may be minimized. Many other embodiments will be apparent to those of skill in the art upon reviewing the above description.

The packaging techniques described herein may be used with a processor as described above, or with flash memory, SRAM, and PsuedoSRAM combinations. Therefore, such processors/packages could be part of system memory as well.

The semiconducting package and method described above provides a solution for stacking dice in semiconducting packages. The semiconducting package also provides circuit designers with a cost-effective option for minimizing the Z height of semiconducting packages.

What is claimed is:

1. A semiconducting package comprising:
   a tape substrate that includes a front side and a back side;
   a first capsule encapsulated onto the front side of the tape substrate, the first capsule including a surface having a recess;
   a second capsule encapsulated onto the front side of the tape substrate, the tape substrate being folded to position the second capsule adjacent to the first capsule; and
   an adhesive substantially filling the recess in the surface of the first capsule to secure the first capsule to the second capsule.

2. The semiconducting package of claim 1, wherein the recess in the surface of the first capsule is a groove.

3. The semiconducting package of claim 1, further comprising a third capsule encapsulated onto the front side of the tape substrate.

4. The semiconducting package of claim 3, wherein the tape substrate is folded to position the third capsule against the back side of the tape substrate opposite to the second capsule.

5. The semiconducting package of claim 1, wherein the recess in the surface of the first capsule includes a plurality of grooves.

6. The semiconducting package of claim 1, wherein the second capsule includes a flat mating surface that engages the first capsule.

7. The semiconducting package of claim 1, wherein the second capsule includes a surface having a recess such that the adhesive substantially fills the recess in the surface of the second capsule to secure the first capsule to the second capsule.

8. The semiconducting package of claim 7, wherein the recess in the first capsule is at least partially aligned with the recess in the second capsule.

9. The semiconducting package of claim 1, wherein the adhesive within the recess extends above the surface of the first capsule.

10. The semiconducting package of claim 1, wherein the adhesive fills the recess in the surface of the first capsule such that the surface of the first capsule engages a flat mating surface of the second capsule.

11. A computer system comprising:
    a bus;
    a random access memory coupled to the bus;
    a semiconducting package that is electrically connected to the bus, the semiconducting package including a first capsule and a second capsule that are each separately encapsulated onto a front side of a tape substrate, the tape substrate being folded to position the second capsule adjacent to the first capsule, the first capsule including a surface having a recess such that an adhesive substantially fills the recess to secure the first capsule to the second capsule.

12. The computer system of claim 11, wherein the recess in the surface of the first capsule is a groove.

13. The semiconducting package of claim 11, further comprising a third capsule encapsulated onto the front side of the tape substrate.

14. The semiconducting package of claim 13, wherein the tape substrate is folded to position the third capsule against the back side of the tape substrate opposite to the second capsule.

15. The semiconducting package of claim 11, wherein the second capsule includes a surface having a recess such that the adhesive substantially fills the recess in the surface of the second capsule to secure the first capsule to the second capsule.

16. The semiconducting package of claim 15, wherein the recess in the first capsule is at least partially aligned with the recess in the second capsule.

17. The semiconducting package of claim 11, wherein the adhesive within the recess extends above the surface of the first capsule.

18. The semiconducting package of claim 11, wherein the adhesive fills the recess in the surface of the first capsule such that the surface of the first capsule engages a flat mating surface of the second capsule.

* * * * *